United States Patent
Kumar et al.

(10) Patent No.: US 11,592,511 B2
(45) Date of Patent: Feb. 28, 2023

(54) METHODS AND SYSTEMS FOR DIAGNOSING MAGNETIC SENSORS

(71) Applicant: Texas Instruments Incorporated, Dallas, TX (US)

(72) Inventors: Harish Kumar, Frisco, TX (US); Srinivasan Venkataraman, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 107 days.

(21) Appl. No.: 17/161,009

(22) Filed: Jan. 28, 2021

(65) Prior Publication Data

US 2021/0373109 A1    Dec. 2, 2021

Related U.S. Application Data

(60) Provisional application No. 63/030,601, filed on May 27, 2020.

(51) Int. Cl.
| | |
|---|---|
| *G01R 33/07* | (2006.01) |
| *G01R 35/00* | (2006.01) |
| *G01R 33/00* | (2006.01) |

(52) U.S. Cl.
CPC .......... *G01R 35/00* (2013.01); *G01R 33/0023* (2013.01); *G01R 33/07* (2013.01)

(58) Field of Classification Search
CPC ............................ G01R 33/0023; G01R 35/00
See application file for complete search history.

(56) References Cited

U.S. PATENT DOCUMENTS

| | | | | |
|---|---|---|---|---|
| 5,343,337 | A | * | 8/1994 | Jurneke ................ G11B 5/3948 |
| 2004/0183528 | A1 | * | 9/2004 | Crouch ................ G01N 27/725 |
| | | | | 324/228 |
| 2013/0187645 | A1 | | 7/2013 | Pannetier-Lecoeur et al. |

FOREIGN PATENT DOCUMENTS

| | | |
|---|---|---|
| JP | H03272484 | 12/1991 |
| JP | H04204278 | 7/1992 |
| RU | 2468376 | 11/2012 |

OTHER PUBLICATIONS

International Search Report in corresponding PCT Application No. PCT/US2021/032684, dated Aug. 19, 2021 (2 pages).

* cited by examiner

*Primary Examiner* — Alesa Allgood
(74) *Attorney, Agent, or Firm* — Michelle F. Murray; Frank D. Cimino

(57) ABSTRACT

A magnetic sensor circuit includes a plurality of magnetic sensors having bias input and bias output terminals and first and second measurement terminals. The circuit includes a diagnostic sensor having bias input and bias output terminals and first and second measurement terminals. The circuit includes a first multiplexer configured to selectively couple a current source to the bias input terminals of the magnetic sensors or to the bias input terminal of the diagnostic sensor and includes a second multiplexer configured to selectively couple the bias output terminals of the magnetic sensors or the bias output terminal of the diagnostic sensor to a first terminal of a switch. The circuit includes a third multiplexer configured to selectively couple the measurement terminals of the magnetic sensors or the measurement terminals of the diagnostic sensor to differential input terminals of an amplifier.

23 Claims, 3 Drawing Sheets

METHODS AND SYSTEMS FOR DIAGNOSING MAGNETIC SENSORS

CROSS REFERENCE TO RELATED APPLICATION

This application claims priority to U.S. Provisional Application No. 63/030,601, filed May 27, 2020, entitled "Methods for Run Time Diagnostics in Magnetic Sensors", which is hereby incorporated by reference herein.

TECHNICAL FIELD

This description relates generally to magnetic sensors.

BACKGROUND

A magnetic sensor such as a Hall-effect sensor is a device used to measure the strength of a magnetic field. The magnetic sensor provides an output voltage that is directly proportional to the magnetic field strength. Magnetic sensors are used for proximity sensing, position and speed detection, and current sensing. A Hall-effect sensor can be combined with a threshold detection circuit so that it acts as a switch.

Due to safety requirements in automotive applications, run time diagnostics are performed on Hall-effect sensors to validate their integrity. A known magnetic field is typically created and isolated from an external magnetic field for run time diagnostics. Current systems include on-chip coils built inside integrated circuits to create a local magnetic field. Current systems require additional on-chip area and consume significant amount of power. Also, current systems typically are not reliable due to challenges associated with isolating the local magnetic field from the external magnetic field.

SUMMARY

In one aspect, a magnetic sensor circuit includes a plurality of magnetic sensors having respective bias input and bias output terminals and respective first and second measurement terminals. The magnetic sensor circuit includes a diagnostic sensor having bias input and bias output terminals and first and second measurement terminals. The magnetic sensor circuit includes a first multiplexer configured to selectively couple a current source to the bias input terminals of the magnetic sensors or to the bias input terminal of the diagnostic sensor. The magnetic sensor circuit includes a second multiplexer configured to selectively couple the bias output terminals of the magnetic sensors or the bias output terminal of the diagnostic sensor to a first terminal of a switch. The switch includes a second terminal coupled to a ground terminal and includes a gate. The magnetic sensor circuit includes a third multiplexer configured to selectively couple the measurement terminals of the magnetic sensors or the measurement terminals of the diagnostic sensor to differential input terminals of an amplifier.

In an additional aspect, the switch is an NFET of which the first terminal is a drain and the second terminal is a source. The NFET is turned on to electrically connect the bias output terminals to the ground terminal.

In an additional, the diagnostic sensor comprises four resistors connected in a wheatstone bridge configuration defining first, second, third and fourth terminals, wherein two opposed terminals are selected as the bias input and bias output terminals and the other two terminals are selected as the measurement terminals.

In an additional aspect, the direction of current flow in the diagnostic sensor is changed periodically by switching to an adjacent terminal and its opposed terminal as the bias input and bias output terminals, respectively, and switching to the other two terminals as the measurement terminals.

In an additional aspect, during a first phase the first and third terminals are selected as the bias input and bias output terminals and the second and fourth terminals are selected as the measurement terminals, wherein during a second phase the second and fourth terminals are selected as the bias input and bias output terminals and the first and third terminals are selected as the measurement terminals.

In an additional aspect, the magnetic sensor circuit includes a demodulator having differential input terminals coupled to the differential output terminals of the amplifier and having an output terminal. The magnetic sensor circuit includes an analog-to-digital converter having an input terminal coupled to the output terminal of the demodulator and having an output terminal. The magnetic sensor circuit includes an operational amplifier having first and second input terminals coupled to the differential output terminals of the third multiplexer and a third input terminal coupled to a common mode terminal and having an output terminal coupled to the gate of the switch.

In an additional aspect, the diagnostic sensor generates a non-sinusoidal reference voltage at the differential output terminals, wherein the amplitude of the reference voltage alternates between minimum and maximum values. The reference voltage comprises a diagnostic sensor output voltage component responsive to a magnetic field and a diagnostic sensor offset voltage component resulting from a mismatch of the diagnostic sensor.

In an additional aspect, a self-diagnostic magnetic sensor circuit includes a plurality of magnetic sensors having respective bias input and bias output terminals and respective first and second measurement terminals. The magnetic sensor circuit includes a diagnostic sensor having bias input and bias output terminals and first and second measurement terminals. The magnetic sensor circuit includes a first multiplexer configured to couple a current source to the bias input terminals of the magnetic sensors during an operating phase and to couple the current source to the bias input terminal of the diagnostic circuit during a diagnostic phase. The magnetic sensor circuit includes a second multiplexer configured to couple the bias output terminals of the magnetic sensors to a first terminal of a switch during the operating phase and to couple the bias output terminal of the diagnostic sensor to the first terminal of the switch during the diagnostic phase, and includes a third multiplexer configured to couple the measurement terminals of the magnetic sensors to differential input terminals of an amplifier during the operating phase and to couple the measurement terminals of the diagnostic sensor to the differential input terminals of the amplifier during the diagnostic phase.

In an additional aspect, a method of diagnosing the signal chain of a magnetic sensor circuit includes generating a reference voltage by periodically switching direction of current flow in a diagnostic sensor. The reference voltage is a non-sinusoidal differential voltage of which the amplitude alternates between minimum and maximum values, wherein the reference voltage comprises a diagnostic sensor output voltage component responsive to an external magnetic field and a diagnostic sensor offset voltage component resulting from a mismatch of the diagnostic sensor. The method includes amplifying the reference voltage, wherein the amplified reference voltage is a differential voltage having an amplifier offset voltage component. The method includes demodulating the amplified voltage by filtering the diagnostic sensor offset voltage component and the amplifier offset voltage component and digitizing the demodulated voltage. The method includes comparing the digitized voltage to the reference voltage to diagnose the signal chain.

In an additional aspect, the method includes generating the reference voltage by periodically switching direction of current flow in the diagnostic sensor by switching to an adjacent terminal and its opposed terminal as the bias input and bias output terminals, respectively, and switching to the other two terminals as the measurement terminals.

In an additional aspect, a method of diagnosing a magnetic sensor includes generating a reference voltage by periodically switching direction of current flow in the magnetic sensor, wherein the reference voltage is a non-sinusoidal differential voltage of which the amplitude alternates between minimum and maximum values. The reference voltage includes a sensor output voltage component responsive to a magnetic field and a sensor offset voltage component resulting from a mismatch of the magnetic sensor. The method includes amplifying the reference voltage, wherein the amplified reference voltage is a differential voltage comprising an amplifier offset voltage component. The method includes demodulating the amplified reference voltage by filtering the sensor offset voltage component and the amplifier offset voltage component and digitizing the demodulated voltage. The method includes determining sensitivity of the magnetic sensor using the digitized voltage.

DETAILED DESCRIPTION

Figure 1:
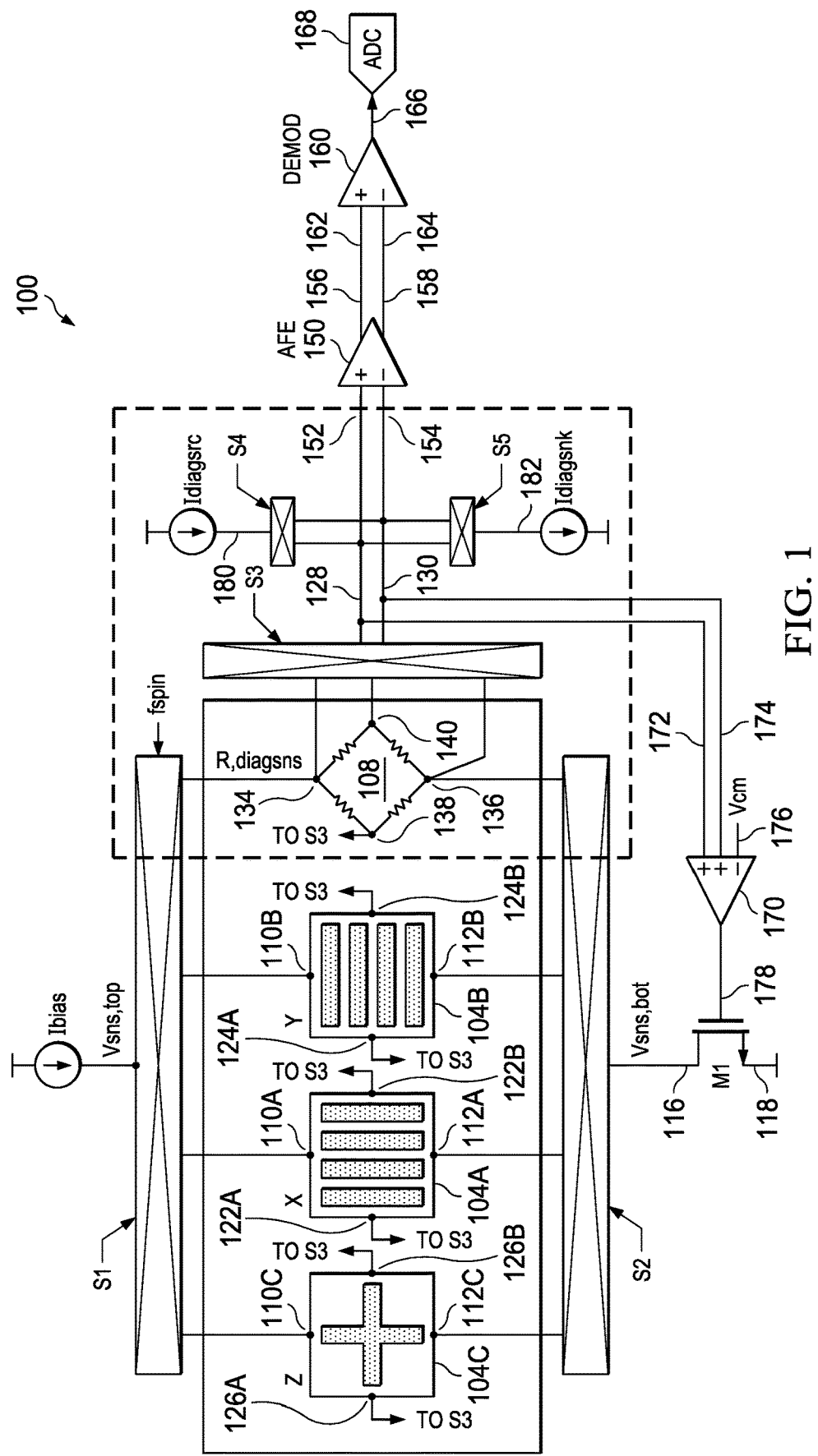
FIG. 1 is a block diagram of a magnetic sensor circuit of an example embodiment.

FIG. 1 is a block diagram of a magnetic sensor circuit 100 of an example embodiment. The magnetic sensor circuit 100 operates in two modes: a diagnostic mode and a normal mode. In the diagnostic mode, the magnetic sensor circuit 100 performs a self-diagnosis to validate the signal chain integrity of the circuit 100. In the normal mode, the magnetic sensor circuit 100 measures an external magnetic field and provides an output voltage representative of the external magnetic field.

Figure 2:
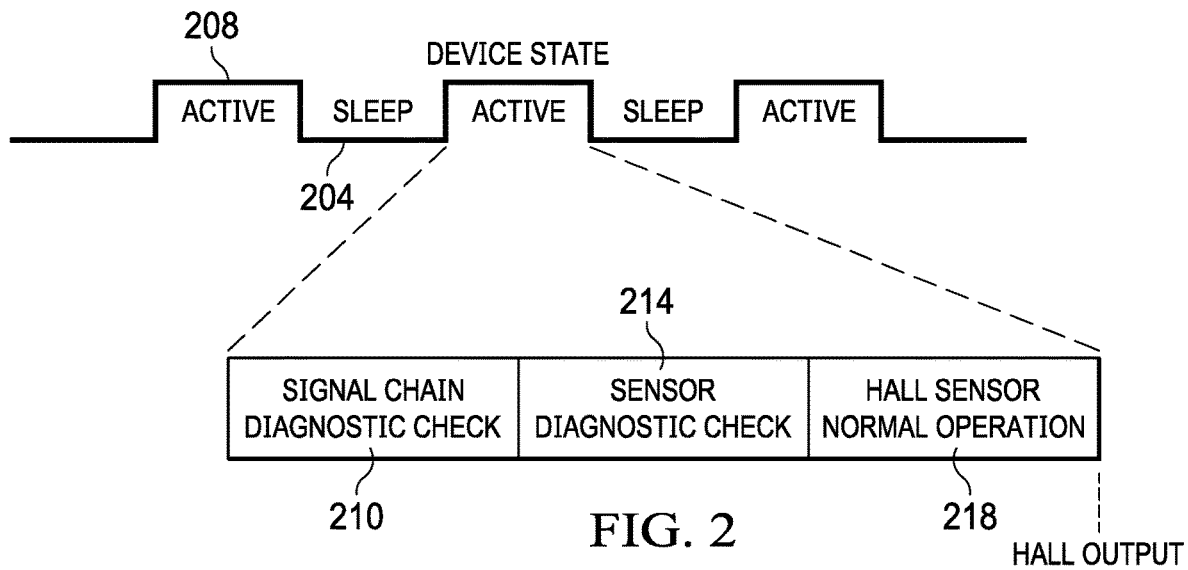
FIG. 2 illustrates a timing diagram.

The magnetic sensor circuit 100 operates in duty cycles having a sleep state and an active state. As illustrated in a timing diagram 200 of FIG. 2, in a sleep state 204 the magnetic sensor circuit 100 is inactive, and in an active state 208 the magnetic sensor circuit 100 performs a signal chain diagnostic check 210 and a sensor diagnostic check 214. Thereafter, the magnetic sensor circuit 100 performs a normal operation 218 which is also referred to as Hall-effect sensor operation.

The magnetic sensor circuit 100 includes three magnetic sensors 104A, 104B, and 104C oriented to measure external magnetic fields in x, y, and z directions, respectively. The magnetic sensor circuit 100 may be constructed with any suitable number of magnetic sensors. The magnetic sensors 104A, 104B, and 104C may, for example, be Hall-effect sensors which provide an output voltage representative of the strength of the external magnetic fields.

The magnetic sensor circuit 100 includes a diagnostic sensor 108 which provides an output voltage that is immune to the external magnetic field. In an example embodiment, the diagnostic sensor 100 is built using resistors (e.g., poly resistors) that do not produce a voltage responsive to the external magnetic field. The resistors in the diagnostic sensor 100 can be connected in a wheatstone bridge network. The diagnostic sensor 108 is used to perform a self-diagnosis to check the integrity of the signal chain of the circuit 100. The diagnostic sensor 108 may, for example, be a resistor network insensitive to the external magnetic field.

The magnetic sensors 104A, 104B, and 104C include respective bias input terminals 110A, 110B and 110C configured to receive a bias current. During the normal operating mode, a switch S1 couples the bias input terminals 110A, 110B and 110C to a current source $I_{bias}$ which provides the bias current. The switch S1 may be implemented with a multiplexer.

The magnetic sensors 104A, 110B, and 104C include respective bias output terminals 112A, 112B and 112C. During the normal operating mode, a switch S2 couples the bias output terminals 112A, 112B and 112C to a first terminal 116 of a switch M1. The switch S2 may, for example, be a multiplexer. The switch M1 has a second terminal 118 coupled to a ground terminal. The ground terminal may be coupled to a ground voltage. The switch M1 may, for example, be an n-channel field effect transistor (NFET) of which the first terminal 116 is a drain and the second terminal 118 is a source. The switch M1 also has a gate. When M1 is turned on, a conduction path is provided for the bias current to flow from the current source $I_{bias}$ to ground.

The magnetic sensor 104A includes measurement terminals 122A and 122B, the magnetic sensor 104B includes measurement terminals 124A and 124B, and the magnetic sensor 104C includes measurement terminals 126A and 126B. Responsive to the external magnetic field, the magnetic sensors 104A, 104B and 104C provide output voltages at the measurement terminals. The output voltage at the measurement terminals is representative of the strength of the external magnetic field. A switch S3 (e.g., a multiplexer) selectively couples the measurement terminals to differential output terminals 128 and 130. During the normal operating mode, the output voltages generated by the magnetic sensors 104A, 104B and 104C are available at the differential output terminals 128 and 130.

The diagnostic sensor 108 includes a bias input terminal 134 and a bias output terminal 136. The diagnostic sensor 108 includes measurement terminals 138 and 140. During the diagnostic mode, the switch S1 couples the bias input terminal 134 to the current source $I_{bias}$ and the switch S2 couples the bias output terminal 136 to the first terminal 116 of the transistor M1, thus providing a conduction path between the current source $I_{bias}$ and ground. Also, during the diagnostic mode, the switch S3 couples the measurement terminals 138 and 140 to the differential output terminals 128 and 130. The diagnostic sensor 108 provides an output voltage immune to the external magnetic field at the measurement terminals 138 and 140.

The magnetic sensor circuit 100 includes an analog front end (AFE) 150 which may be an amplifier. The AFE 150 includes differential inputs 152 and 154 coupled to the differential outputs 128 and 130, respectively. During the diagnostic mode, a switch S4 connects a current source, $I_{diagsrc}$, to the 152 input of the AFE 150 and a switch S5 connects a current sink, $I_{diagsnk}$, to the input 154 of the AFE 150. The AFE 150 applies a predetermined gain to the differential voltage provided by the magnetic sensors 104A-104C or the diagnostic sensor 108 and provides an amplified differential signal at outputs 156 and 158. The magnetic sensor circuit 100 includes a demodulator 160 coupled to receive the amplified differential signal at inputs 162 and 164. The demodulator 160 demodulates the amplified signal and provides a filtered signal at an output 166. An analog-to-digital converter (ADC) 168 digitizes the filtered signal.

In an example embodiment, the magnetic sensor circuit 100 includes an operational amplifier 170 having first and second input terminals 172 and 174, respectively, coupled to the respective differential output terminals 128 and 130, of the third switch S3 and a third input terminal 176 coupled to a common mode terminal to which a common mode voltage can be applied. The operational amplifier 170 also includes an output terminal 178 coupled to a gate of the switch M1. Responsive to the differential voltages at the terminals 128 and 130 and a common mode voltage, the operational amplifier 170 applies a gate voltage to the switch M1 to control the current through M1, and thus control the current in the magnetic sensors 104A-104C and the diagnostic sensor 108.

Figure 3:
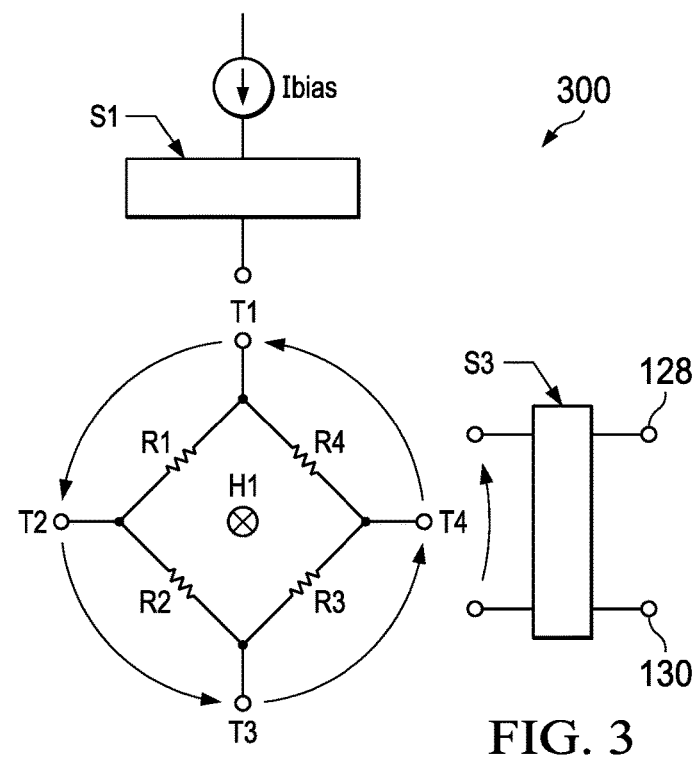
FIG. 3 is a schematic diagram of a magnetic sensor of an example embodiment.

In an example embodiment, the magnetic sensors 104A-104C and the diagnostic sensor 108 are implemented with four resistors connected in a wheatstone bridge configuration. FIG. 3 illustrates a sensor 300 which may be one of the magnetic sensors 104A-104C or the diagnostic sensor 108. The sensor 300 comprises four resistors R1, R2, R3 and R4 connected in a bridge configuration defining first, second, third and fourth terminals, T1, T2, T3 and T4, respectively. The sensor 300 is operated in four phases, and in each phase a different pair of opposed terminals is selected as the bias input and bias output terminals while the other pair of opposed terminals is selected as the measurement terminals. For example, in phase 1, terminals T1 and T3 may be selected as the bias input and output terminals, respectively, while the two opposed terminals T2 and T4 may be selected as the measurement terminals. During phase 1, the switch S1 couples the current source $I_{bias}$ to terminal T1. Thus, the bias current flows through the resistors R1, R2, R3 and R4 and out via terminal T3. Responsive to an external magnetic field H1, the sensor 300 provides an output voltage at the measurement terminals T2 and T4. The switch S3 couples the measurement terminals T2 and T4 during phase 1 to the differential output terminals 128 and 130.

In phase 2, terminals T2 and T4 may be selected as the bias input and output terminals, respectively, while the two opposed terminals T1 and T3 may be selected as the measurement terminals. During phase 2, the switch S1 couples the current source $I_{bias}$ to terminal T2. Thus, the bias current flows through the resistors R1, R2, R3 and R4 and out via terminal T4. Responsive to an external magnetic field H1, the sensor 300 provides an output voltage at the measurement terminals T1 and T3. The switch S3 couples the measurement terminals T1 and T3 during phase 2 to the differential output terminals 128 and 130.

In phase 3, terminals T3 and T1 may be selected as the bias input and output terminals, respectively, while the two opposed terminals T2 and T4 may be selected as the measurement terminals. During phase 3, the switch S1 couples the current source $I_{bias}$ to terminal T3. Thus, the bias current flows through the resistors R1, R2, R3 and R4 and out via terminal T1. Responsive to an external magnetic field H1, the sensor 300 provides an output voltage at the measurement terminals T2 and T4. The switch S3 couples the measurement terminals T2 and T4 during phase 2 to the differential output terminals 128 and 130.

In phase 4, terminals T4 and T2 may be selected as the bias input and output terminals, respectively, while the two opposed terminals T1 and T3 may be selected as the measurement terminals. During phase 4, the switch S1 couples the current source $I_{bias}$ to terminal T4. Thus, the bias current flows through the resistors R1, R2, R3 and R4 and out via terminal T2. Responsive to an external magnetic field H1, the sensor 300 provides an output voltage at the measurement terminals T1 and T3. The switch S3 couples the measurement terminals T1 and T3 during phase 2 to the differential output terminals 128 and 130.

By coupling the current source $I_{bias}$ to a different bias input terminal during each phase, the direction of current flow in the sensor 300 is periodically changed. As a result, a periodic non-sinusoidal voltage is generated at the measurement terminals of the sensor 300. The amplitude of the non-sinusoidal voltage at the measurement terminals alternates between minimum and maximum values.

During the diagnostic mode, the magnetic sensor circuit 100 is configured to check the integrity of the magnetic sensors 104A-104C by measuring the magnetic sensor offset and the offset of the AFE 150. In this mode the current souce $I_{bias}$ provides a current with a predetermined value to the magnetic sensors. The direction of current flow in the magnetic sensor 104A-104C is periodically switched. Responsive to the external magnetic field the magnetic sensor provides a periodic non-sinusoidal voltage, which is referred to as a hall voltage, at the differential output terminals 128 and 130. The output voltage comprises a diagnostic sensor offset voltage component and a magnetic sensitive diagnostic sensor output voltage component corresponding to the current source, $I_{bias}$, the resistance of the magnetic sensor and the external magnetic field. The offset component is generated due to a mismatch of the resistors of the sensor, and the magnetic sensitive voltage component is generated by the magnetic sensor which is responsive to the external magnetic field. Since the external magnetic field might be an unknown value during the diagnostic mode it is necessary to ignore its effect. The signal at the differential output terminals 128 and 130 is amplified by the AFE 150. At the output of the AFE 150, an offset component is added due to a mismatch in the AFE 150. The signal at the output of the AFE 150 can be represented as:

$$V_{ph(i)} = (-1)^{i+1} V_{Hall} + V_{OS,Hall,ph(i)} + V_{OS,AFE}, \text{ where:}$$

$V_{ph(i)}$=AFE output signal for each phase (1, 2, 3 and 4)
$V_{Hall}$=Hall-effect voltage component
$V_{OS,Hall,ph(i)}$=Hall sensor offset voltage component
$V_{OS,AFE}$=AFE offset voltage component Based on the above:

$$V_{ph(1)} + V_{ph(2)} + V_{ph(3)} + V_{ph(4)} = 4(V_{OS,Hall,ph(i)} + V_{OS,AFE})$$

The magnetic sensor integrity may be determined from the sum of the offset of the magnetic sensors and the analog front end as shown below even in the presence of an unknown external magnetic field.

$$(V_{OS,Hall,ph(i)} + V_{OS,AFE}) = (\tfrac{1}{4})(V_{ph(1)} \pm V_{ph(2)} + V_{ph(3)} + V_{ph(4)})$$

In normal operation, the sensor output corresponding to the external field is demodulated using the demodulator 160 as below:

$$V_{ph(1)} - V_{ph(2)} + V_{ph(3)} - V_{ph(4)} = 4(V_{Hall})$$

During the diagnostic mode, the circuit 100 is configured to verify the signal chain integrity using the diagnostic sensor 108. In an example embodiment, in the diagnostic mode, in addition to the bias current $I_{bias}$, diagnostic current sources $I_{diagsrc}$ and sink $I_{diagsnk}$ are applied to the diagnostic sensor 108. The diagnostic current source $I_{diagsrc}$ can be connected to the differential terminals 128 and 130 by a switch S4 and the diagnostic current sink, $I_{diagsnk}$ can be connected to the differential terminals 128 and 130 by a switch S5. The switch S3 connects the differential terminals 128 and 130 to the diagnostic sensor 108 and thus applies the diagnostic current source $I_{diagsrc}$ and the diagnostic current sink, $I_{diagsnk}$ to the diagnostic sensor 108. The diagnostic current source $I_{diagsrc}$ and the diagnostic current sink, $I_{diagsnk}$ have predetermined values and can be referred to as reference currents to the diagnostic sensor 108.

The direction of current flow of $I_{bias}$, $I_{diagsrc}$ and $I_{diagsn}$ is periodically switched in the diagnostic sensor 108. In phase 1 and phase 3, a terminal 180 of the diagnostic current source is switched to the terminal 152 and a terminal 182 of the diagnostic current sink is switched to the terminal 154. In phase 2 and phase 4, the terminal 180 of the diagnostic current source is switched to the terminal 154 and the terminal 182 of the diagnostic current sink is switched to the terminal 152. Immune to the external magnetic field and $I_{bias}$ the diagnostic sensor 108 provides a periodic non-sinusoidal voltage, which is referred to as a diagnostic reference voltage at the differential output terminals 128 and 130. Both the diagnostic currents ($I_{diagsrc}$, $I_{diagsnk}$) may have the same value ($I_{diagsrc}$). The diagnostic reference voltage comprises a diagnostic sensor offset component and a known diagnostic reference voltage component corresponding to the diagnostic current sources ($I_{diagsrc}$) and the resistance of the diagnostic sensor, $R_{diagsns}$. The diagnostic sensor offset component is generated due to a mismatch of the resistors of the diagnostic sensor 108, and the known diagnostic reference voltage component is generated by the diagnostic sensor 108 immune to the external magnetic field and due to the voltage drop created by the reference diagnostic currents flowing through the diagnostic sensor. Since the diagnostic reference currents have a known value, the resulting diagnostic reference voltage component also has a known value. The signal at the differential output terminals 128 and 130 is amplified by the AFE 150. At the output of the AFE 150, an offset component is added to the signal due to a mismatch in the AFE 150. The signal at the output of the AFE 150 can be represented as:

$$V_{ph(i)} = (-1)^{i+1} V_{ref,diag} + V_{OS,Hall,ph(i)} + V_{OS,AFE}, \text{ where:}$$

$V_{ph(i)}$=AFE output signal for each phase (1, 2, 3 and 4)
$V_{ref,diag} = I_{diagsrc} * R_{diagsns}$ (Diagnostic Reference Voltage Component)
$V_{OS,diag,ph(i)}$=Diagnostic sensor offset voltage component
$V_{OS,AFE}$=AFE offset voltage component
Based on the above:

$$V_{ph(1)} - V_{ph(2)} + V_{ph(3)} - V_{ph(4)} = 4(V_{ref,diag})$$

Thus, the signal chain integrity may be determined by obtaining a known output reference voltage based on demodulation of the four different phases:

$$(V_{ref,diag}) = (1/4)(V_{ph(1)} - V_{ph(2)} + V_{ph(3)} + V_{ph(4)}).$$

Figure 4:
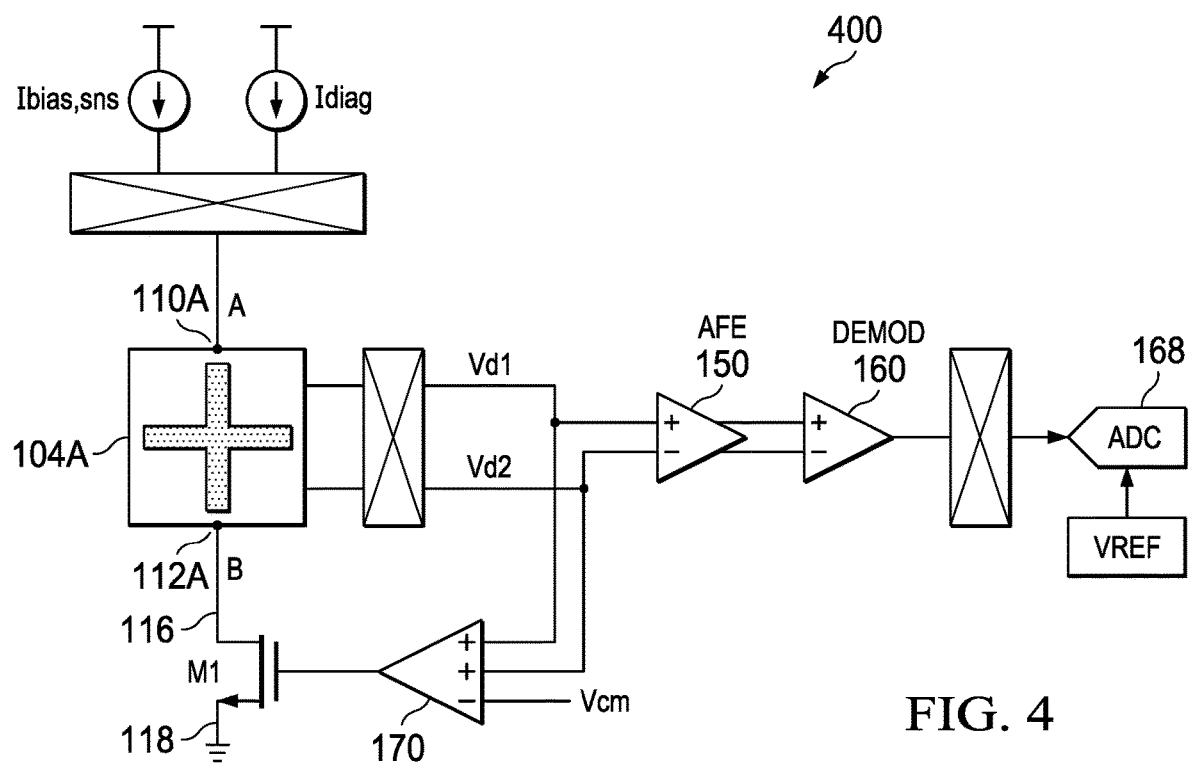
FIG. 4 is a block diagram of a test circuit of an example embodiment.

In an example embodiment, the magnetic sensor circuit 100 is configured to perform a sensor integrity check to verify the sensitivity of the magnetic sensors 104A-104C. FIG. 4 illustrates a simplified circuit 400 for the sensor integrity check of the magnetic sensor 104A. The bias input terminal 110A of the magnetic sensor 104A is coupled to the current source and the bias output terminal 112A is coupled to the drain 116 of the transistor M1. During the sensor integrity check, the current source generates a current $I_{diag}$ using a known voltage $V_{diag}$ and a resistor $R_{diag}$. Responsive to $I_{diag}$, which has a known value, the magnetic sensor 104A provides a differential output voltage V(d1–d2) which can be represented as:

$$V(d1-d2) = (I_{diag}) * (R_{Hall})$$

Where $R_{Hall}$ is the equivalent resistance of the magnetic sensor 104.
After substituting ($V_{bg}/R_{diag}$) for $I_{diag}$:

$$V(d1-d2) = (V_{bg}/R_{diag}) * R_{Hall} = K * V_{bg}$$

Where $K = R_{Hall}/R_{diag}$ and is defined as the sensitivity constant.

Thus, by measuring the differential voltage V(d1–d2) responsive to a known current value, the sensitivity of the magnetic sensor 104A can be determined. As discussed before, the differential voltage can be determined from the output of the ADC 168 converter which provides a digital signal representative of the differential voltage.

Figure 5:
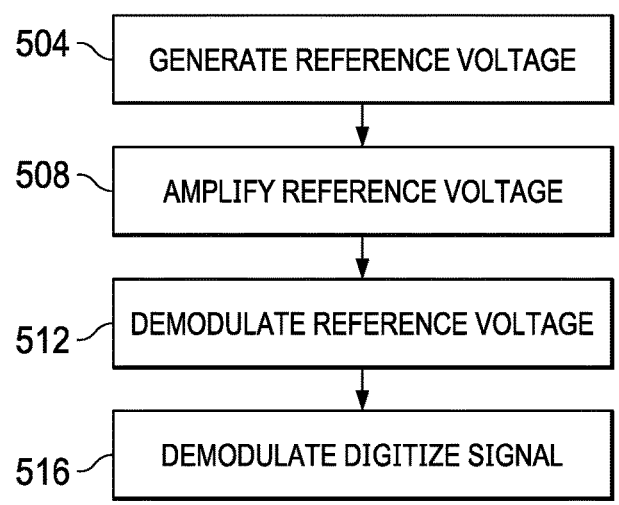
FIG. 5 is a flow diagram of an example embodiment.

FIG. 5 is a flow diagram of a method of diagnosing the signal chain of a magnetic sensor circuit of an example embodiment. In a block 504, a reference voltage is generated by periodically switching direction of current flow in a diagnostic sensor. The reference voltage is a non-sinusoidal differential voltage of which the amplitude alternates between minimum and maximum values. The reference voltage comprises a diagnostic sensor output voltage component responsive to a magnetic field and a diagnostic sensor offset voltage component resulting from a mismatch of the diagnostic sensor. In a block 508, the reference voltage is amplified by an analog front end. The amplified voltage is a differential voltage which includes an amplifier offset voltage component. In a block 512, the amplified reference voltage is demodulated by filtering the diagnostic sensor offset voltage component and the amplifier offset voltage component. In a block 516, the demodulated signal is digitized. The signal chain is diagnosed using the digitized signal and comparing to the reference voltage.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:
1. A magnetic sensor circuit, comprising:
a plurality of magnetic sensors having respective bias input and bias output terminals and respective first and second measurement terminals;
a diagnostic sensor having bias input and bias output terminals and first and second measurement terminals;
a first multiplexer configured to selectively couple a current source to the bias input terminals of the magnetic sensors or the bias input terminals of the diagnostic sensor;

a second multiplexer configured to selectively couple the bias output terminals of the magnetic sensors or the bias output terminal of the diagnostic sensor to a first terminal of a switch; and a third multiplexer configured to selectively couple the measurement terminals of the magnetic sensors or the measurement terminals of the diagnostic sensor to differential input terminals of an amplifier.

2. The magnetic sensor circuit of claim 1, wherein a direction of current flow in the magnetic sensors or in the diagnostic sensor is periodically changed.

3. The magnetic sensor circuit of claim 1, wherein a direction of current flow in the diagnostic sensor is changed periodically by switching to an adjacent terminal and its opposed terminal as the bias input and bias output terminals, respectively, and switching to the other two terminals as the measurement terminals.

4. The magnetic sensor circuit of claim 1, further comprising:
a demodulator having differential input terminals coupled to differential output terminals of the amplifier and having an output terminal; and
an analog-to-digital converter having an input terminal coupled to the output terminal of the demodulator and having an output terminal.

5. The magnetic sensor circuit of claim 1, further comprising an operational amplifier having first and second input terminals coupled to differential output terminals of the third multiplexer and a third input terminal coupled to a common mode terminal and having an output terminal coupled to a gate of the switch.

6. The magnetic sensor circuit of claim 1, wherein the switch includes a second terminal coupled to a ground terminal and includes a gate.

7. The magnetic sensor circuit of claim 6, wherein the switch is an NFET of which the first terminal is a drain and the second terminal is a source, and wherein the NFET is turned on to electrically connect the bias output terminals to the ground terminal.

8. The magnetic sensor circuit of claim 1, wherein the diagnostic sensor comprises four resistors connected in a wheatstone bridge configuration defining first, second, third and fourth terminals, and wherein two opposed terminals are selected as the bias input and bias output terminals and the other two terminals are selected as the measurement terminals.

9. The magnetic sensor circuit of claim 8, wherein during a first phase the first and third terminals are selected as the bias input and bias output terminals and the second and fourth terminals are selected as the measurement terminals, and wherein during a second phase the second and fourth terminals are selected as the bias input and bias output terminals and the first and third terminals are selected as the measurement terminals.

10. The magnetic sensor circuit of claim 1, wherein the diagnostic sensor generates a non-sinusoidal reference voltage at the measurement terminals, and wherein an amplitude of the reference voltage alternates between minimum and maximum values.

11. The magnetic sensor circuit of claim 10, wherein the reference voltage comprises a diagnostic sensor output voltage component responsive to a magnetic field and a diagnostic sensor offset voltage component resulting from a mismatch of the diagnostic sensor.

12. A self-diagnostic magnetic sensor circuit, comprising:
a plurality of magnetic sensors having respective bias input and bias output terminals and respective first and second measurement terminals;
a diagnostic sensor having bias input and bias output terminals and first and second measurement terminals;
a first multiplexer configured to couple a current source to the bias input terminals of the magnetic sensors during an operating phase and to couple the current source to the bias input terminals of the diagnostic sensor during a diagnostic phase;
a second multiplexer configured to couple the bias output terminals of the magnetic sensors to a first terminal of a switch during the operating phase and to couple the bias output terminal of the diagnostic sensor to the first terminal of the switch during the diagnostic phase; and
a third multiplexer configured to couple the measurement terminals of the magnetic sensors to differential input terminals of an amplifier during the operating phase and to couple the measurement terminals of the diagnostic sensor to the differential input terminals of the amplifier during the diagnostic phase.

13. The self-diagnostic magnetic sensor circuit of claim 12, wherein a direction of current flow in the magnetic sensors or in the diagnostic sensor is periodically changed.

14. The self-diagnostic magnetic sensor circuit of claim 12, wherein a direction of current flow in the diagnostic sensor is changed periodically by switching to an adjacent terminal and its opposed terminal as the bias input and bias output terminals, respectively, and switching to the other two terminals as the measurement terminals.

15. The self-diagnostic magnetic sensor circuit of claim 12, further comprising:
a demodulator having differential input terminals coupled to differential output terminals of the amplifier and having an output terminal; and
an analog-to-digital converter having an input terminal coupled to the output terminal of the demodulator and having an output terminal.

16. The self-diagnostic magnetic sensor circuit of claim 12, further comprising an operational amplifier having first and second input terminals coupled to the differential input terminals of the amplifier and a third input terminal coupled to a common mode terminal and having an output terminal coupled to a gate terminal of the switch.

17. The self-diagnostic magnetic sensor circuit of claim 12, wherein the switch includes a second terminal coupled to a ground terminal and includes a gate.

18. The self-diagnostic magnetic sensor circuit of claim 17, wherein the switch is an NFET of which the first terminal is a drain and the second terminal is a source, and wherein the NFET is turned on to electrically connect the bias output terminals to the ground terminal.

19. The self-diagnostic magnetic sensor circuit of claim 12, wherein the diagnostic sensor comprises four resistors connected in a wheatstone bridge configuration defining first, second, third and fourth terminals, and wherein two opposed terminals are selected as the bias input and bias output terminals and the other two terminals are selected as the measurement terminals.

20. The self-diagnostic magnetic sensor circuit of claim 19, wherein during a first phase the first and third terminals are selected as the bias input and bias output terminals and the second and fourth terminals are selected as the measurement terminals, and wherein during a second phase the second and fourth terminals are selected as the bias input and bias output terminals and the first and third terminals are selected as the measurement terminals.

21. The magnetic sensor circuit of claim 12, wherein the diagnostic sensor generates a non-sinusoidal reference voltage at the measurement terminals, and wherein an amplitude of the reference voltage alternates between minimum and maximum values.

22. The magnetic sensor circuit of claim 21, wherein the reference voltage comprises a diagnostic sensor output voltage component responsive to an external magnetic field and a diagnostic sensor offset voltage component resulting from a mismatch of the diagnostic sensor.

23. The magnetic sensor circuit of claim 22, wherein a transition between the minimum and maximum values is instantaneous.

* * * * *